United States Patent [19]

Bowers

[11] Patent Number: 4,888,589
[45] Date of Patent: Dec. 19, 1989

[54] DIGITAL-TO-ANALOG CONVERTER WITH DIODE CONTROL

[75] Inventor: Derek F. Bowers, Sunnyvale, Calif.

[73] Assignee: Precision Monolithics, Inc., Santa Clara, Calif.

[21] Appl. No.: 204,589

[22] Filed: Jun. 9, 1988

[51] Int. Cl.$^4$ .............................................. H03M 1/80
[52] U.S. Cl. .................................... 341/153; 341/154; 341/133
[58] Field of Search ............... 341/118, 119, 120, 121, 341/144, 153, 154, 133

[56] References Cited

U.S. PATENT DOCUMENTS

| | | | |
|---|---|---|---|
| 3,328,792 | 6/1967 | Stone et al. | 341/154 |
| 3,610,953 | 10/1971 | Gordon et al. | 341/153 |
| 3,815,121 | 6/1974 | Wilensky | 341/153 |
| 4,016,555 | 4/1977 | Tyrrel | 341/153 |
| 4,573,036 | 2/1986 | Wondra | 341/153 |
| 4,758,820 | 7/1988 | Tateno | 341/154 |

FOREIGN PATENT DOCUMENTS

| | | | |
|---|---|---|---|
| 362459 | 1/1973 | U.S.S.R. | 341/154 |
| 762164 | 9/1980 | U.S.S.R. | 341/153 |

OTHER PUBLICATIONS

Schade, Jr., "Voltage Matching For A Ladder Network", 3/1981, No. 1271, RCA Technical Notes.

Primary Examiner—William M. Shoop, Jr.
Assistant Examiner—H. L. Williams
Attorney, Agent, or Firm—Koppel & Jacobs

[57] ABSTRACT

A digital-to-analog converter (DAC) ladder segment is disclosed in which diode networks are introduced into the ladder step circuits. Each diode network includes a control diode which controls the flow of current through the network in accordance with a signal from an associated actuating circuit, which in turn is controlled by an input digital signal. In one embodiment, the control diodes are connected in series with resistors, with the diodes and resistors scaled so that their respective bit circuits conduct desired current levels. In another embodiment, the control diodes have equal scalings and are connected in series with respective resistors and second diodes which are called so that their step circuits conduct the desired currents. In a third embodiment, current sources are provided which supply currents to the second diodes in amounts that permit the second diode and the resistors for the various step circuits to have substantially equal scalings. The different embodiments can also be combined to obtain the advantages of each. Current errors associated with metallization resistances ae substantially reduced by implementing the control diodes as bipolar transistors, having their bases and collectors connected together at a location remote from the diodes by means of metallic base and collector leads that are electrically isolated from each other in the vicinity of the diodes.

10 Claims, 7 Drawing Sheets

DIGITAL-TO-ANALOG CONVERTER WITH DIODE CONTROL

BACKGROUND OF THE INVENTION

1. Field of the Invention

This invention relates to digital-to-analog converters (DACs), and more particularly to DACs implemented as integrated circuits.

2. Description of the Prior Art

Numerous types of DACs have been designed which convert input digital signals to an output analog format. A basic type of DAC, referred to as a weighted R device, is shown in FIG. 1. It consists of a series of binarily weighted resistors which are connected in common to one side to an output line 2, each resistor comprising one step of the ladder. For n steps, the resistor in the circuit for the most significant bit (MSB) has a value R, while the resistor in the circuit for the least significant bit (LSB) has a value $2^{n-1}R$. The resistance values for the intermediate bits are scaled binarily between the MSB and LSB. Each resistor can be connected by means of a switch 4 to either a ground line 6, or a common voltage reference line 8. For any given input signal, the step circuits corresponding to the input bits having a digital 1 are connected to the voltage reference line 8, while the step circuits corresponding to the bits having a digital 0 are connected to the ground line 6. In this way, an output signal equal to the weighted sum of the currents flowing through the various steps connected to the voltage reference line 8 will appear on output line 2. This signal is amplified and converted to an output voltage signal $V_0$ by means of amplifier 10 having a feedback resistor $R_F$.

While the weighted R circuit is simple in design, a large number of resistors are required to give it a useful range; the higher value resistors can become quite large and occupy undesirably amounts of area on the chip.

Another type of conventional DAC, referred to as an R-2R ladder device, is shown in FIG. 2. In this device the various steps have equal value 2R resistors. The input sides of the circuits are switched between a voltage reference line 8 and a ground line 6 by means of switches 4 in a manner similar to the weighted R device of FIG. 1. The output sides of successive steps, however, are connected to each other through additional resistors of resistance value R, with the output of the LSB connected to ground through a 2R resistor. An output analog voltage $V_0$ is obtained from the output of the MSB through amplifier 10 with feedback resistor $R_F$. The switch for the MSB step is controlled directly by the most significant bit of the input digital signal, the switch for the next most significant step is controlled by the second most significant bit of the input digital signal, and so forth.

A binary relationship is established between successive bits of the R-2R ladder circuit. While it is more economical for the number of resistors required than is the weighted R circuited of FIG. 1, it still requires switching between two definite voltage levels, and is subject to substantial temperature variations.

A different design, referred to as a segmented DAC, is shown in FIG. 3. Again, individual ladder steps circuits are switched between a voltage reference line 8 and a ground line 6. As in the designs of FIGS. 1 and 2, MOS switches are typically employed. The ladder steps each have the same resistance R, and are connected in parallel between the voltage reference/ground lines 8/6 and the output line 2. A very large number of step resistance circuits, equal to $2^{n-1}$, are used, where n is equal to the number of bits in the input digital signal. A decode logic circuit 12 is provided which converts the input digital signal, consisting of bits B1-Bn, into a control signal which connects the appropriate number of steps to the voltage reference line 8. For example, for an 8 bit input digital signal with 511 different possible values, 511 separate step circuits would be provided, and the number of steps connected to the voltage reference line at any time would equal the value of the input digital signal.

While more accurate than the weighted R or R-2R designs, the segmented DAC requires an extremely large number of resistors, which increases geometrically with the number of bits in the input digital signal. Also, because switching occurs over a relatively large voltage range between $V_{REF}$ and ground, switching is still relatively slow because of the capacitance associated with practical semiconductor switches.

A modification of the FIG. 3 approach which attempts to compensate for its slow switching speed is shown in FIG. 4. In this design the switches 4 are moved to the output side of the resistors, and therefore do not have to switch all the way between the voltage reference and ground. While this design offers some improvement and is in common use in many CMOS DACs, the capacitance associated with practical switches degrades the phase margin of the amplifier, leading to a requirement for extremely low capacitance switches to obtain high speed performance.

Bipolar transistor switches offer faster switching speeds than most MOS transistors because the bipolar devices are smaller. A conventional DAC design using bipolar transistors is shown in FIG. 5. A ladder network is provided with resistors having equal resistance values for a segmented device, or weighted resistance values for a weighted ladder; an R-2R ladder can also be used. The network is referenced to a negative voltage level obtained from the positive voltage reference line 8, via inverting amplifier 14. Transistor Q1 is a compensating element for transistors Q2–Q4, which provide current sources for accumulated an analog output. The resistor ladder network divides the currents through the transistors Q2–Q4 such that the current through each transistor is decremented by a predetermined portion of the current through the preceding transistor for a weighted ladder, or is equal to the other transistor currents for a segmented ladder. The base-emitter junctions of transistors Q1–Q4 are geometrically scaled in a weighted ladder to offset the effect of the different current levels, which otherwise would produce a different $V_{be}$ for each transistor.

Each of the bit transistors Q2–Q4 is supplied through a respective pair of bipolar switching transistors, with Q5 and Q6 supplying Q2, Q7 and Q8 supplying Q3, and Q9 and Q10 supplying Q4. The outputs of Q5, Q7 and Q9 are connected to ground and are actuated when no output is desired from their respective bits, while the outputs of Q6, Q8 and Q10 are connected to an output line 2.

Q1 compensates for the error associated with Q2–Q4, where $\alpha$ equals $1-1/\beta$, and $\beta$ is the transistor current gain. Similarly, another bipolar transistor Q11 is provided between voltage reference line 8 and Q1 to compensate for the $\alpha$ error associated with Q6, Q8 and Q10. Any mismatches of $\alpha$ between the various transistors are not compensated, but can generally be overcome by trimming the resistors. However, since α is dependent upon β, and β varies by a factor of about 1:3 over the military specification temperature range of −55° C. to 125° C., the α errors cannot be trimmed out over this temperature range. This can lead to serious operating problems, especially with DACs of over 12 bits. In some cases the transistor switches Q5–Q10 have been replaced with diode switches, but β still has a significant temperature variation because the DAC currents still have to pass through transistors Q1–Q4.

SUMMARY OF THE INVENTION

In view of the above problems with the prior art, the object of the present invention is to provide a novel DAC which has high speed operation, is accurate and relatively temperature insensitive, is not wasteful of power or chip space, and can accommodate a large number of bits.

These objects are achieved with a novel DAC design in which each step circuit includes a control diode that controls the flow of current through the step in accordance with a corresponding control signal from an associated actuating circuit. In one implementation, a single diode is employed on the output side of each ladder resistor. The resistance values and diode areas are weighted for a weighted ladder design, and equal for a segmented ladder.

In another implementation, a control diode is connected on the output side of each ladder resistor, and a second diode is connected on the voltage reference side. The resistors are weighted, but a corresponding weighting of the control diodes is avoided by providing the second diodes with a double weighting. Although this results in a large differential in area for the second diodes, switching speed is not degraded significantly because the voltage swings at the second diodes are quite small.

Another variation also uses second diodes in each step circuit, but allows them to have equal areas by also providing a current source for each step circuit which injects a predetermined amount of current into the second diode so that the various step circuits conduct their intended levels of current. For this purpose the current sources are scaled in proportion to $2^{(b-1)}$, where b is the order of the step circuit in which the current source is located.

Various combinations of the different embodiments can be used to create an optimum design for a particular application. With the control diodes implemented as bipolar transistors, having their bases and collectors connected together, a further enhancement is achieved by making the base-collector connection at a location remote from the diodes by means of metallic base and collector leads that are electrically isolated from each other in the vicinity of the diodes. Metallization resistances associated with the leads thereby effect the step currents generally only in proportion to the transistor base currents, rather than in proportion to the collector currents, while the transistors remain unsaturated.

Further features and advantages of the invention will be apparent to those skilled in the art from the following detailed description of various preferred embodiments, taken together with the accompanying drawings in which:

DETAILED DESCRIPTION OF PREFERRED EMBODIMENTS

Figure 1:
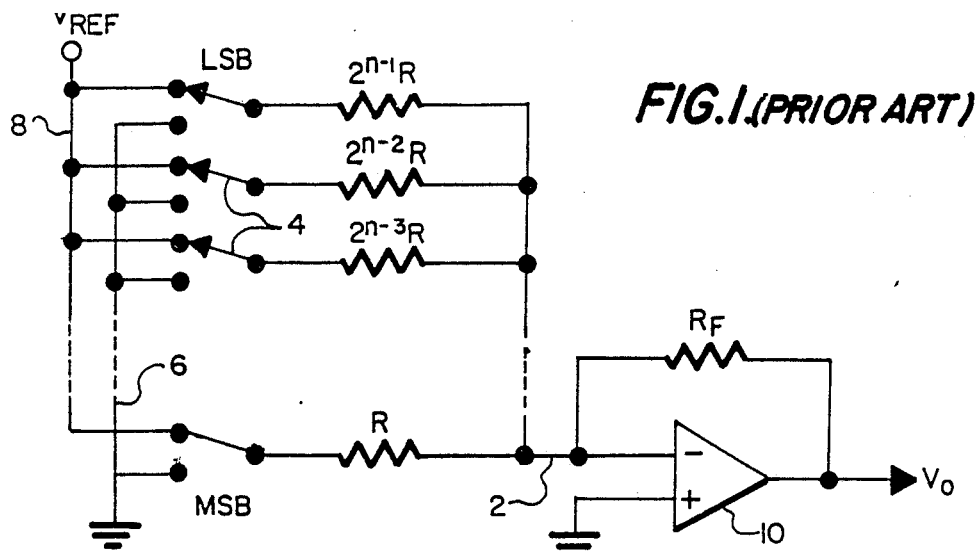
FIGS. 1–4 are schematic diagram of various prior art DAC circuits employing MOS switches.
Figure 2:
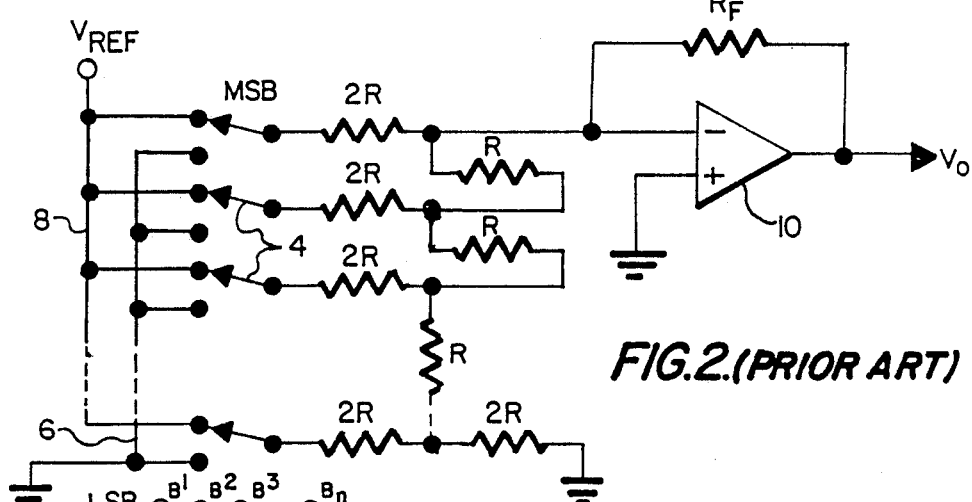
Figure 3:
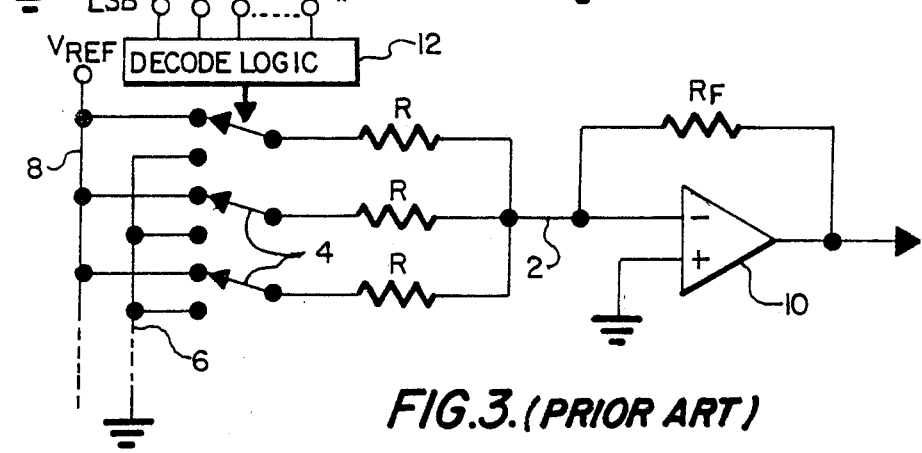
Figure 4:
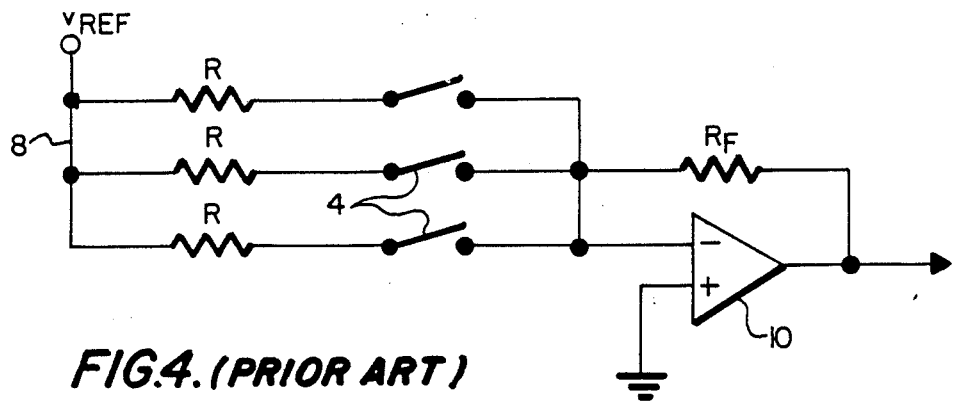
Figure 5:
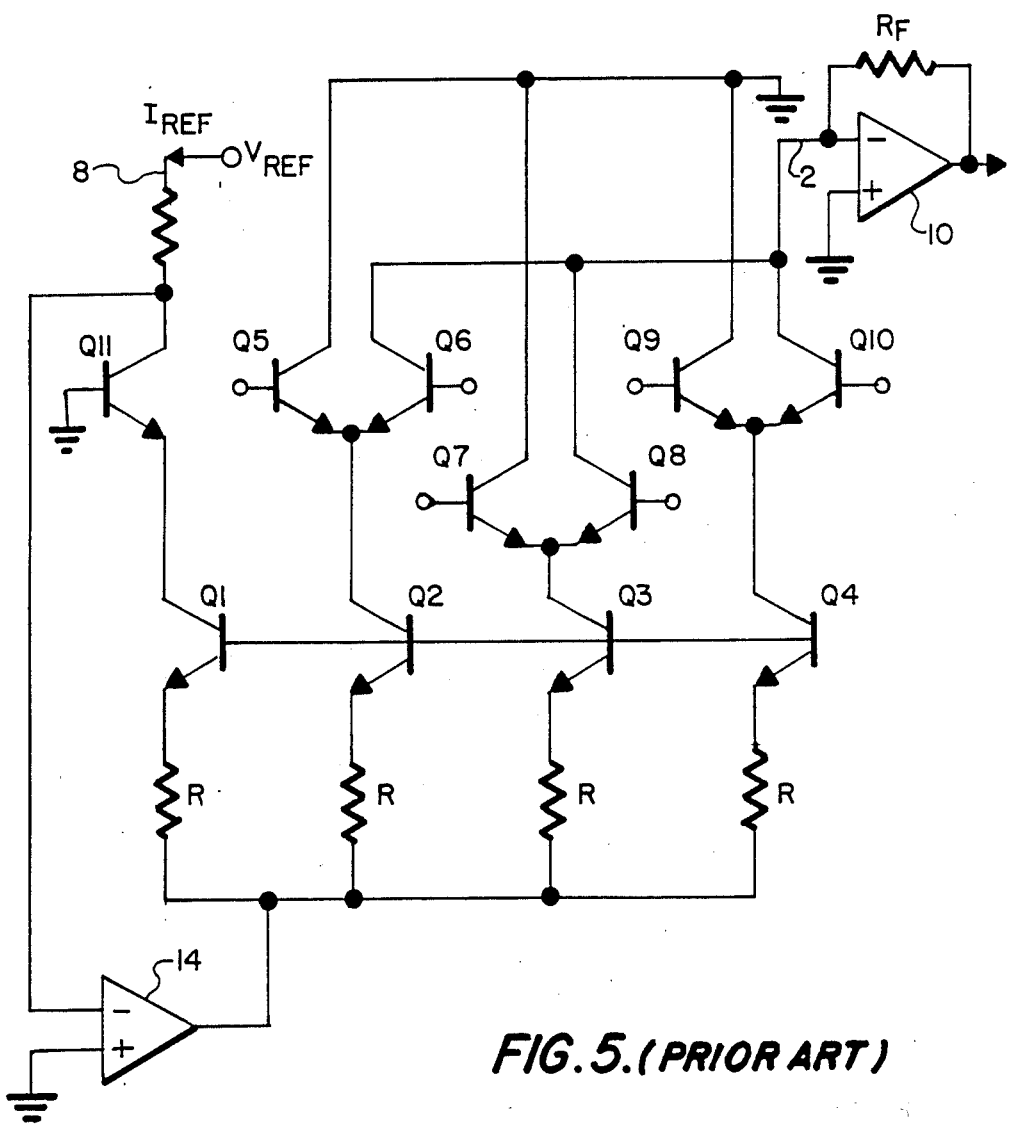
FIG. 5 is a schematic diagram of a prior art DAC circuit employing bipolar switches.
Figure 6:
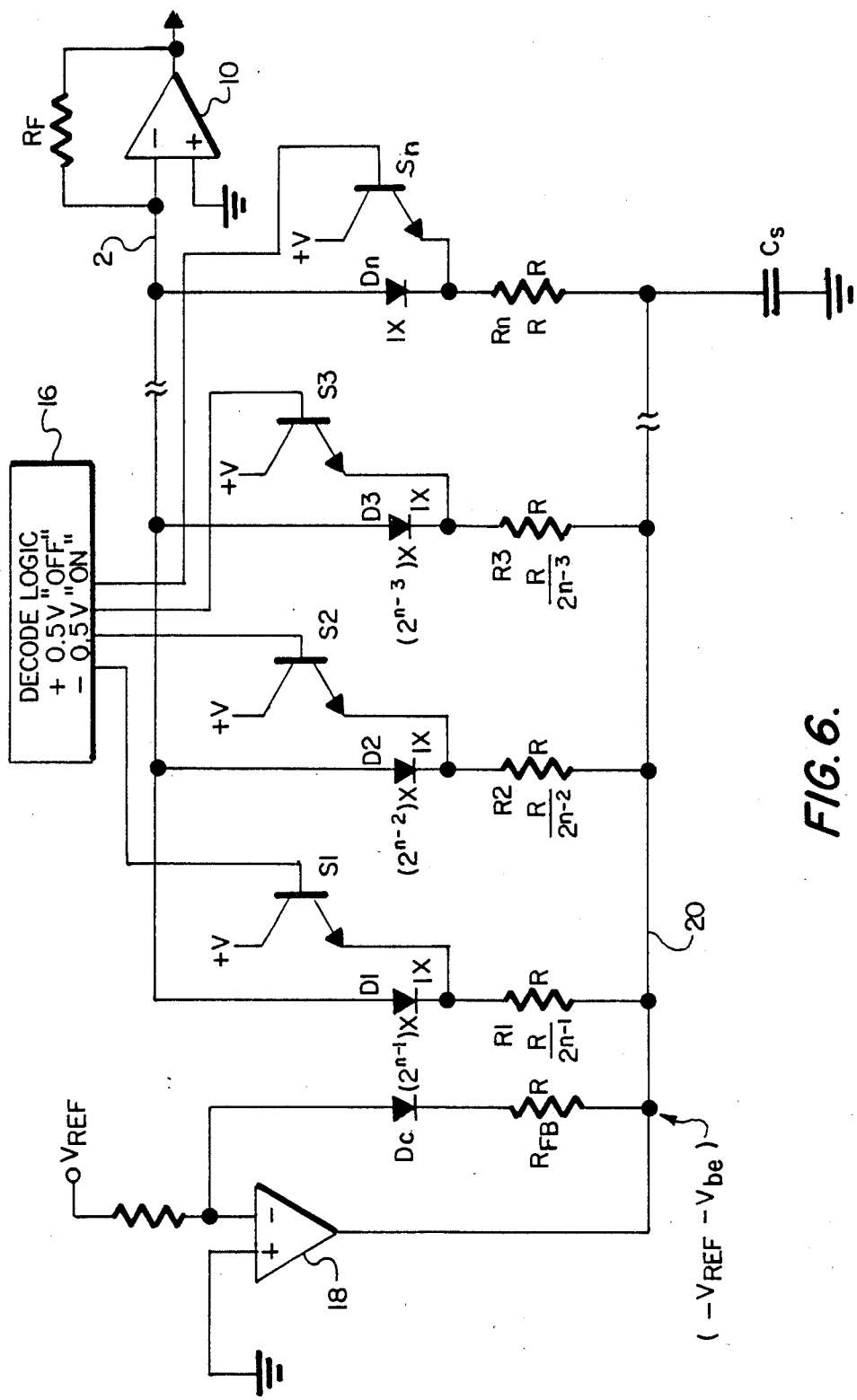
FIG. 6 is a schematic diagram of one embodiment of the present invention in which single diodes are incorporated into each step of a DAC ladder.

FIG. 6 shows one embodiment of the present invention in which control diodes are introduced into the DAC step circuits to overcome the various problems with prior DACs. Only a segment of a DAC ladder is shown, consisting of resistors R1, R2, R3 and Rn. Similar circuitry would be provided for the remaining steps of the full DAC.

The embodiment of FIG. 6 is adaptable to both segmented ladders and weighted ladders. For a weighted ladder having n steps, a corresponding segmented ladder would have $2^{n-1}$ steps. For a weighted ladder the resistor values are scaled in proportion to $\frac{1}{2}(n+1-b)$, where b is the order of the step, b being equal to one for the most significant bit and equal to n for the least significant bit. The weighted ladder resistance values are indicated to the left of resistors R1–Rn in FIG. 6. For a segmented DAC all of the resistance values would be equal, as indicated by the common resistance value R to the right of each of the resistors R1–Rn. An R-2R ladder could also be used.

In accordance with the invention, diodes D1–Dn are connected in series with each of the step resistors R1–Rn, respectively. The diodes are located on the output sides of their corresponding resistors, and conduct current in a direction toward the resistors. The other sides of the diodes D1–Dn are connected together via common output line 2 to the output amplifier 10, which produces an analog output signal representing the sum of the signals from each of the individual step circuits at any particular time.

The diodes D1–Dn are preferably implemented as bipolar transistors with their bases and collectors connected together. Their base-emitter junctions are geometrically scaled so that their areas vary inversely with the amount of current for each bit, thereby keeping the voltage drops across the various scaled in proportion to $2^{(n-b)}$ for a weighted ladder, as indicated by the scalings to the left of each diode symbol in FIG. 6 (x is a unit diode area). For a segmented ladder the steps carry equal currents, and therefor their diodes have the same scalings as indicated by the 1x term to the right of D1-Dn.

Current flow through each of the various step circuits is controlled by a decode logic circuit 16 and a series of transistors switches S1, S2, S3, Sn associated with the respective bit circuits. For a binarilly weighted ladder, decode logic circuit 16 would simply furnish switch signals to each step circuit representing the "1" or "0" state if the input digital bit corresponding to that step circuit.

In the preferred embodiment, each switch comprises a bipolar transistor having its collector connected to a positive voltage bus, its emitter connected to the cathode of its respective control diode, and its base supplied with a control signal from decode logic circuit 16. When any particular step is to be turned "off", a +0.5 volt signal is delivered to its corresponding switch from the decode logic circuit, turning the switch "on". This permits current to flow through the switch from the positive voltage bus to supply the step current, thereby raising the voltage at the diode cathode to hold the diode "off" and prevent any output current from the step. Conversely, a step is turned "on" by applying a −0.5 volt signal from the decode logic circuit to its base. This holds the switch "off", thereby permitting the step current to be supplied through the control diode and appear as an output from the DAC.

The lower end of the ladder circuit is maintained at a negative voltage by means of a negative feedback loop consisting of an op amp 18 with a resistor $R_{FB}$ and compensating diode Dc in its feedback circuit. The inverting input of amplifier 18 is connected to a positive voltage reference, so that a negative reference appears at its output along negative reference line 20. The presence of compensating diode Dc in the feedback circuit adds a negative base-emitter voltage drop to the negative reference level, thereby compensating for the voltage drops across step diodes D1-Dn. A smoothing capacitor Cs is also connected to the negative voltage line 20 to smooth switching glitches.

With this DAC, rapid switching is achieved if the number of steps is kept small, and there is no current loss associated with the diodes because they do not lose base current. However, if more than four or five steps are desired for a weighted ladder, the size of the largest diodes must be increased to a level at which they begin to have significant capacitance, which in turn slows down the achievable switching rate.

Figure 7:
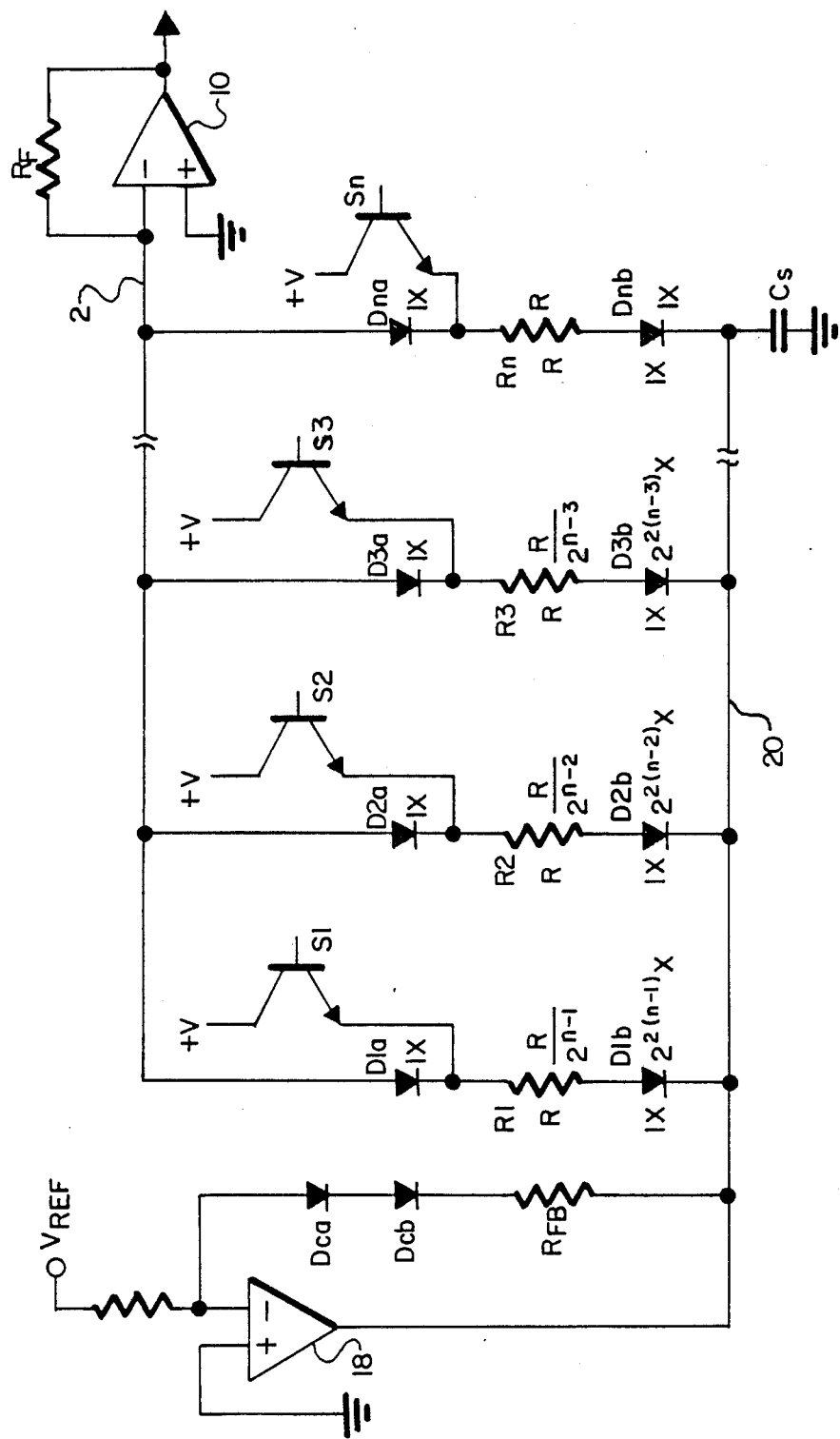
FIG. 7 is a schematic diagram of another embodiment of the invention in which pairs of diodes are incorporated into each step of a DAC ladder.

A variation of the circuit which permits a larger number of weighted steps without an accompanying loss of operating speed is shown in FIG. 7, with the same reference numerals used for common elements. Rather than a single diode on the output side of each step resistor R1-Rn, a pair of diodes are used, one on each side of the resistor. The diodes D1a-Dna on the output side of the resistors have equal geometric scalings 1x. The diodes D1b-Dnb on the negative reference side of the resistors, however, have a large scaling ratio $2^{2(n-b)}$. The lower diodes increase in size by a factor of 4 from step to step. When combined with the uniform size upper diodes, the overall currents and voltages for each step are the same as for the circuit of FIG. 6. A pair of compensating diodes Dca and Dcb are employed in the inverting circuits used to set up the negative voltage reference. The FIG. 7 circuit could also be implemented as a segmented ladder, with equal resistance values and lower diode scalings; the segmented values are indicated to the left of the resistors and lower diodes. A logic decode circuit used with a segmented version is not shown.

Since the upper diodes have a common small scaling of 1x, they exhibit a low level of capacitance and do not interfere materially with operating speed. On the other hand, the lower diodes for the more significant bits have a high capacitance. However, since the lower diodes are on the negative reference side of the resistors R1-Rn, they are subject to only small voltage swings. Therefore, they can become quite large without slowing the switching speed significantly.

Even lower capacitances for the upper diodes D1a-Dna may be achieved for integrated circuits by implementing them as bipolar transistors having their collectors and bases connected in common, with each of the transistors located in a common epitaxial tub on the chip. This arrangement is illustrated in FIG. 8.

While the circuit of FIG. 7 has a lower output capacitance than that of FIG. 6 and can accommodate a greater number of steps without sacrificing switching speed, the large areas required by the lower diodes as the number of steps increases imposes a practical limitation. This problem is effectively resolved with the use of much smaller diodes in accordance with the circuit of FIG. 9. The reference, output, and logic decode circuits have not been shown, but would be provided comparable to those in FIGS. 6 and 7. The lower diodes D1b-Dnb are held to a common scaling of 1x by the addition of current sources I1, I2, I3, In, which supply predetermined current levels to the lower diodes for their respective steps. The magnitudes of the current sources are selected so that the variation in voltage drops across the lower diodes for the various steps will be the reverse of and balance out the variation in voltage drops across the upper diodes. Specifically, the current sources are scaled in proportion to $2^{n-1}$ for a binary weighted ladder. The current source I1 for the first step supplies a current I which is equal to the output current from that step. Depending upon the particular circuit, I will be in the range of a few hundred nanoamps to several miliamps.

Figure 8:
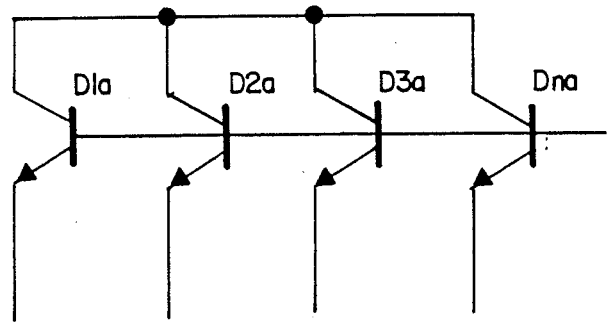
FIG. 8 is a schematic diagram showing the diodes of various step circuits formed in a common epitaxial tub.
Figure 9:
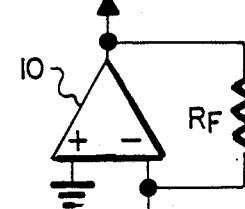
FIG. 9 is a schematic diagram of another embodiment of the invention in which scaled currents are injected into each diode-step circuit.
Figure 9:
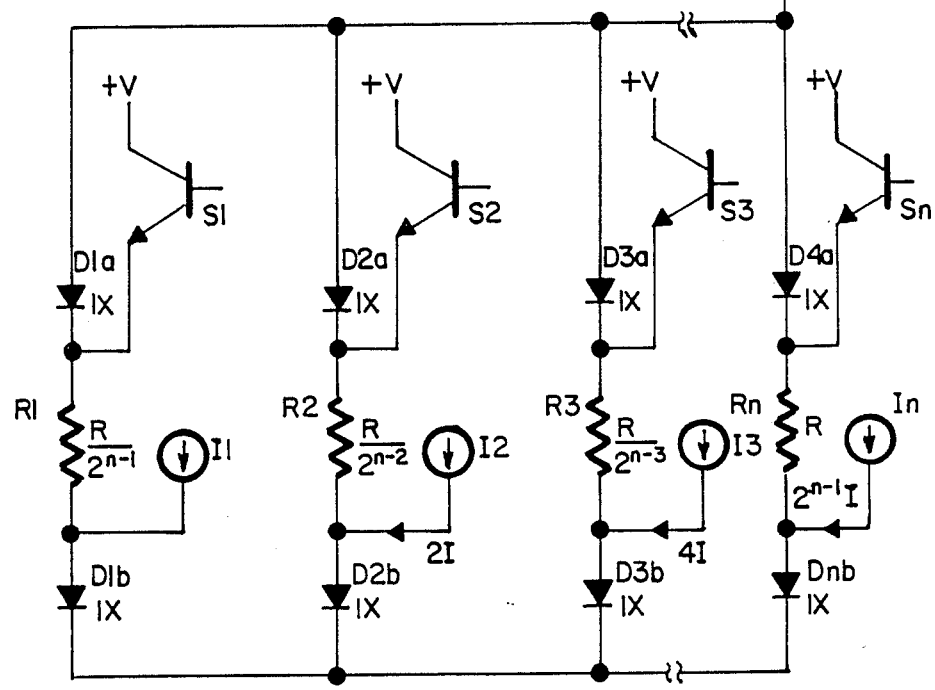
Figure 10:
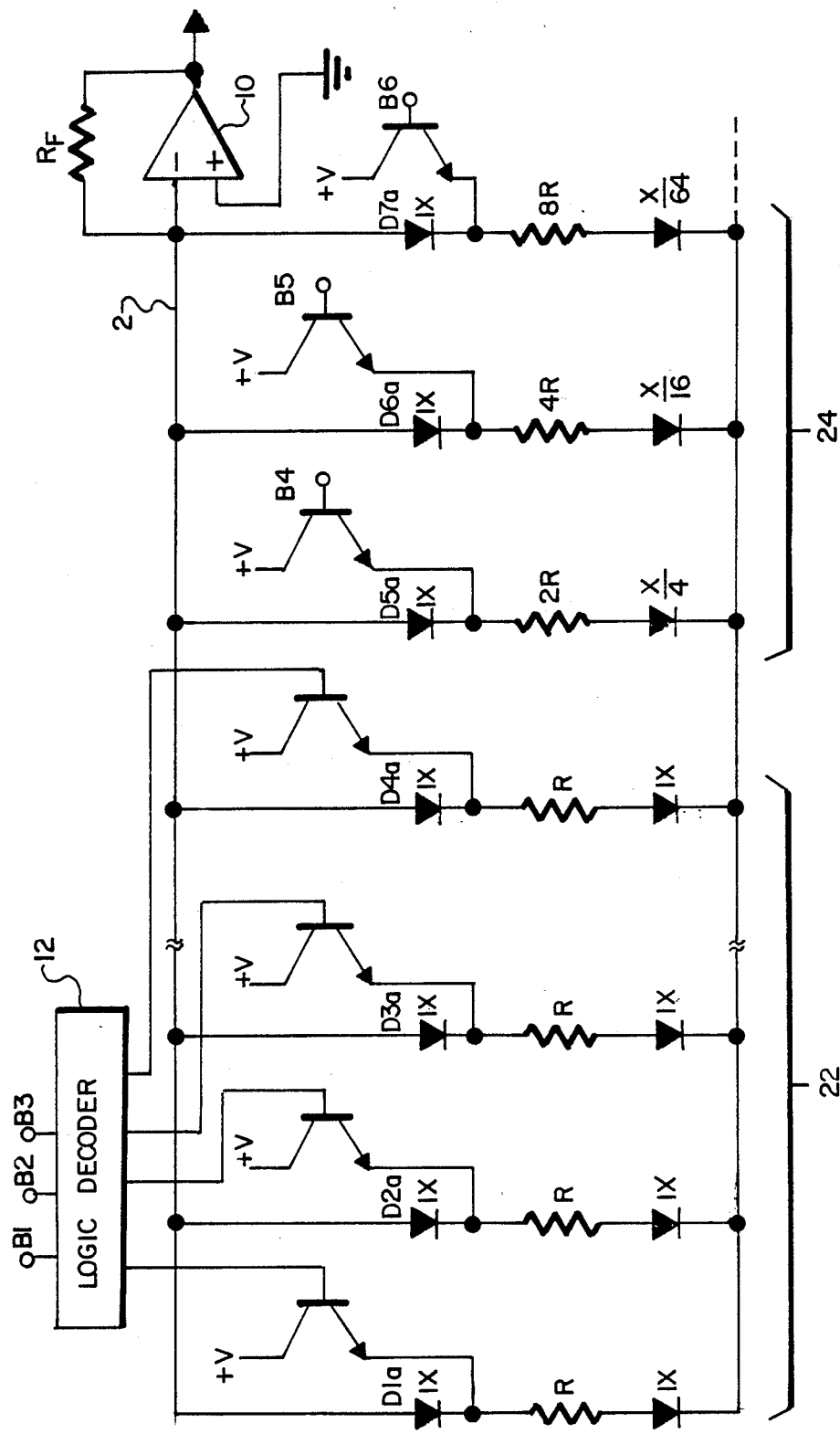
FIG. 10 is a schematic diagram of another embodiment in which an overall DAC is provided in accordance with the invention by combining a segmented ladder with a weighted ladder.

While the circuit of FIG. 9 is more economical of chip area than the circuit of FIG. 8, it also has limitations if the circuit includes too many steps. The result can be very small resistors for the higher order steps and very large currents for the lower order steps, with a substantial power loss. These limitations can be substantially alleviated by combining the various approaches discussed above into an overall DAC. For example, FIG. 10 illustrates the combination of a segmented ladder portion and a weighted ladder portion, both using the scheme of FIG. 7; a segmented ladder portion from FIG. 7 could also be combined with a weighted ladder portion from FIG. 9. A seven-step ladder capable of accepting six input digital bits is illustrated for simplicity, but normally a considerably larger device would be implemented. The three most significant input digital bits, B1, B2 and B3, are supplied to logic decoder 12, which outputs switching signals to four steps of a segmented ladder 22. The less significant bits B4, B5 and B6 control the switching of corresponding step circuits in the weighted ladder portion 24. An output signal will be accumulated on output line 2 which represents the arithmetic sum of the segmented circuits that have been switched "on" by logic decoder 12, plus the weighted outputs of any steps from the weighted ladder portion 24 that have been switched "on". In this manner, rapid switching rates can be maintained with a large number of input digital, without significant problems of excessive use of power or chip area.

Figure 11:
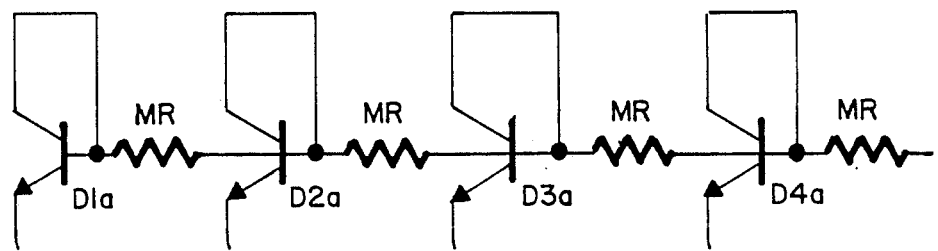
FIG. 11 is a schematic diagram of an embodiment in which diode connections are made locally, thereby introducing errors in the ladder current levels.

When implemented as an IC, the metallization patterns used to connect the diode-connected transistors have associated metallization resistances that can introduce errors into the step currents. The situation is illustrated in FIG. 11, in which the diodes D1a, D2a, D3a and D4a have been isolated. As described so far, the diodes are implemented by bipolar transistors whose collectors have been connected to their bases. The bases of the various diodes are in series, with metallization resistances MR inherently associated with the connections therebetween. These metallization resistances are in series with the bit resistors, and therefore can introduce errors into the bit currents.

Figure 12:
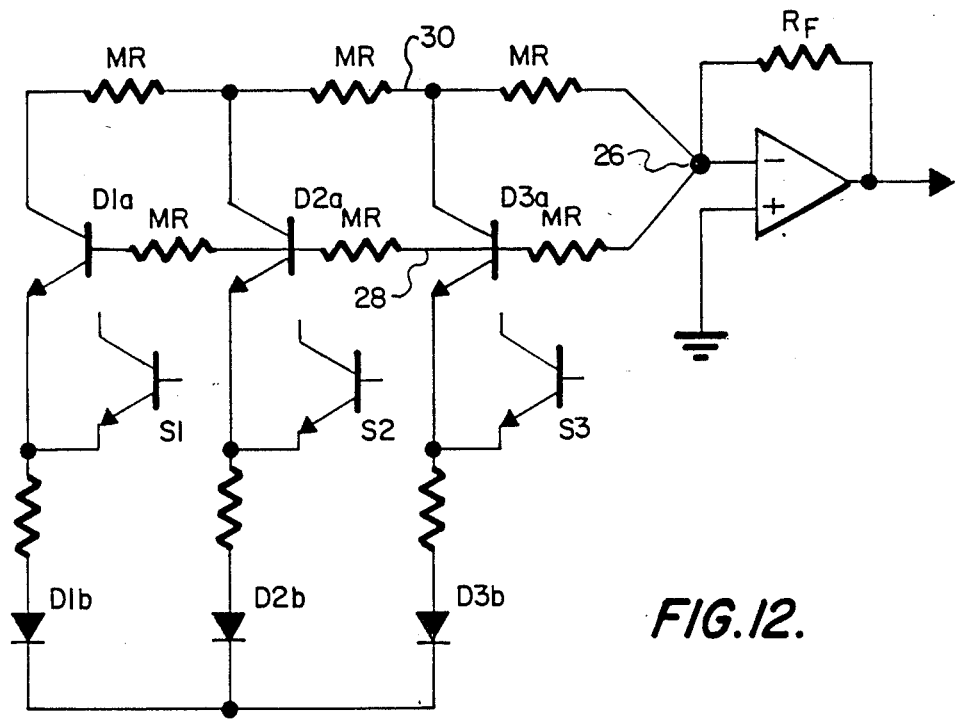
FIG. 12 is a schematic diagram of an improvement to the design of FIG. 11 in which diode connections for each of the steps are made at a remote location, thereby significantly reducing current errors.

The solution provided by the present invention is shown in FIG. 12. Rather than connecting the collector and base of each diode transistor at the site of each device, a single connection 26 for each of the devices is made at a location remote from the diodes by means of metallic base and collector leads 28, 30, which are electrically isolated from each other in the vicinity of the diodes. The base lead 30 will have metallization resistances MR associated with each diode, as will the collector lead 30. This will result in relatively large voltage drops across the collector metallization resistances, but these voltage drops will not change the bit currents so long as the diodes are not saturated, which is normally the case. The step currents will vary with the base-emitter voltage of each diode ($V_{be}$), which in turn varies with the base current. The metallization resistances in the base lead 28 will effect the base currents, but since the base current is less than the collector current by a factor equal to the diode-transistor current gain $\beta$, the step current error for each step caused by metallization resistances will also be reduced by a factor of about $\beta$. Since $\beta$ is typically about 100, the current errors will be mostly eliminated.

Several different embodiments of the invention have thus been shown and described. Since numerous variations and alternate embodiments will occur to those skilled in the art, it is intended that the invention be limited only in terms of the appended claims.

I claim:

1. A digital-to-analog converter (DAC) ladder segment for producing an output analog signal in response to a multi-digit input digital signal, comprising:

a plurality of step circuits connected to accumulate an analog output current based upon the currents flowing through each of the individual step circuits, each step circuit being rendered either conductive or non-conductive at any particular time in response to respective control signals, said step circuits comprising respective diode networks constructed to conduct desired current levels for their respective step circuits, each diode network including a control diode which enables or disables the flow of current through said network in accordance with the step circuit's control signal, each of said diode networks comprising its respective control diode connected in series with a resistor and a second diode, the control diodes for the different step circuits having substantially equal geometric scalings, said resistors being scaled in resistance and said second diodes being geometrically scaled so that their respective step circuits conduct their desired current levels, and a plurality of actuating circuits, each actuating circuit being associated with a respective step circuit and connected to apply a control signal to the control diode of its step circuit in response to digital signal input for that step circuit.

2. A digital-to-analog converter (DAC) ladder segment for producing an output analog signal in response to a multi-digit input digital signal, comprising:

a plurality of step circuits connected to accumulate an analog output current based upon the currents flowing through each of the individual step circuits, each step circuit being rendered either conductive or non-conductive at any particular time in response to respective control signals, said step circuits comprising respective diode networks constructed to conduct desired current levels for their respective step circuits, each diode network including a control diode which enables or disables the flow of current through said network in accordance with the step circuit's control signal, each of said diode networks comprising its respective control diode connected in series with a resistor and a second diode, the control diodes for the different step circuits having substantially equal geometric scalings, the second diodes for the various step circuits having substantially equal geometric scalings and the resistors for the various step circuits having substantially equal resistance scalings so that said step circuits conduct substantially equal currents, and a plurality of actuating circuits, each actuating circuit being associated with a respective step circuit and connected to apply a control signal to the control diode of its step circuit in response to digital signal input for that step circuit.

3. A digital-to-analog converter (DAC) ladder segment for producing an output analog signal in response to a multi-digit input digital signal, comprising:

a plurality of step circuits connected to accumulate an analog output current based upon the currents flowing through each of the individual step circuits, each step circuit being rendered either conductive or non-conductive at any particular time in response to respective control signals, said step circuits comprising respective diode networks constructed to conduct desired current levels for their respective step circuits, each diode network including a control diode which enables or disables the flow of current through said network in accordance with the step circuit's control signal, each of said diode networks comprising its respective control diode connected in series with a resistor and a second diode, and a current source connected to supply current to said second diode, the control diodes for the different step circuits having substantially equal geometric scalings, the second diodes for the different step circuits having substantially equal geometric scalings, the resistors for the different step circuits having substantially equal resistance scalings, and said current sources supplying predetermined current levels to the second diodes of their respective diode networks so that the step circuits conduct their desired current levels, and a plurality of actuating circuits, each actuating circuit being associated with a respective step circuit and connected to apply a control signal to the control diode of its step circuit in response to digital signal input for that step circuit.

4. A digital-to-analog converter (DAC) ladder segment for producing an output analog signal in response to a multi-digit input digital signal, comprising:
a plurality of step circuits connected to accumulate an analog output current based upon the currents flowing through each of the individual step circuits, each step circuit being rendered either conductive or non-conductive at any particular time in response to respective control signals, said step circuits comprising respective diode networks constructed to conduct desired current levels for their respective step circuits, each diode network including a control diode which enables or disables the flow of current through said network in accordance with the step circuits control signal, and
a plurality of actuating circuits, each actuating circuit being associated with a respective step circuit and connected to apply a control signal to the control diode of its step circuit in response to the digital signal input for that step circuit.
said DAC ladder segment implemented as an integrated circuit, wherein said control diodes are implemented as bipolar transistors having their bases and collectors connected in common, said connection being made at a location remote from the diodes by metallic base and collector leads that are electrically isolated from each other in the vicinity of the diodes, whereby metallization resistances associated with said leads effect the step circuit currents substantially only in proportion to the transistor base currents, rather than in proportion to the collector currents, when the transistors are unsaturated.

5. The DAC ladder segment of claim 4, further comprising voltage source means connected to said step circuits to provide said step circuit currents.

6. A digital-to-analog connector (DAC) ladder segment for producing an output analog signal in response to a multi-digit input digital signal, comprising:
an output line,
a voltage reference line,
n step circuits ranging progressively from a least to a most significant bit and connected in parallel between said output and voltage reference lines to accumulate an analog output current equal to the sum of the currents in each of the step circuits, each step circuit comprising a control diode connected to the output line, a second diode connected to the voltage reference line, and a resistor connected between the control and second diodes, the control diode sizes being substantially equal, the resistor values being scaled in proportion to $\frac{1}{2}^{(n-b)}$, and the second diode sizes being scaled in proportion to $2^{2(n-b)}$, where b is the order of the step circuit in which the diodes and resistors are located, with b equal to one for the most significant bit and n for the least significant bit, and
a plurality of switches, each switch connected in circuit with the control diode of a respective step circuit and operating in response to an input digital signal to render the control diode either conductive or nonconductive.

7. The DAC ladder segment of claim 6, implemented as an integrated circuit, wherein said control diodes are implemented as bipolar transistors having their bases and collectors connected in common, said connection being made at a location remote from the diodes by metallic base and collector leads that are electrically isolated from each other in the vicinity of the diodes, whereby metallization resistances associated with said leads effect the step circuit currents substantially only in proportion to the transistor base current, rather than in proportion to the collector current, when the transistors are unsaturated.

8. A digital-to-analog converter (DAC) ladder segment for producing an output analog signal in response to a multi-digit input digital signal, comprising:
an output line,
a voltage reference line,
n step circuits ranging progressively from a least to a most significant bit, said step circuits being connected in parallel between said output and voltage reference lines to accumulate an analog output current equal to the sum of the currents in each of the step circuits, each step circuit comprising a control diode connected to the output line, a second diode connected to the voltage reference line, a resistor connected between the control and second diodes, and a current source connected to supply current to the second diode, the control diode sizes being substantially equal, the second diode sizes being substantially equal, the resistors having substantially equal resistance values, and the current source values being scaled in proportion to $2^{(b-1)}$, where b is the order of the step circuit in which the current source is located, with b equal to one for the most significant bit and n for the least significant bit, and
a plurality of switches, each switch connected in circuit with the control diode of a respective step circuit and operating in response to an input digital signal to render the control diode either conductive or non-conductive.

9. The DAC ladder segment of claim 8, implemented as an integrated circuit, wherein said control diodes are implemented as bipolar transistors having their bases and collectors connected in common, said connection being made at a location remote from the diodes by metallic base and collector leads that are electrically isolated from each other in the vicinity of the diodes, whereby metallization resistances associated with said leads effect the step circuit currents substantially only in proportion to the transistor base current, rather than in proportion to the collector current, when the transistors are unsaturated.

10. An integrated circuit digital-to-analog converter (DAC) ladder segment for producing an output analog signal in response to a multi-digit input digital signal, comprising:
n step circuits ranging progressively from a least to a most significant bit and connected in parallel to accumulate an analog output current equal to the sum of the currents in each of the step circuits, each step circuit comprising a diode connected in series with a resistor, the diode sizes being scaled in proportion to $2^{(n-b)}$ and the resistor values being scaled in proportion to $\frac{1}{2}^{(n-b)}$, where be is the order of the step current in which the diodes and resistors are located, with b equal to one for the most significant bit and n for the least significant bit, said diodes being implemented as bipolar transistors having their bases and collectors connected in common, said connection being made at a location remote from the diodes by metallic base and collector leads that are electrically isolated from each other in the vicinity of the diodes, whereby metallization resistances associated with said leads effect the step circuit currents substantially only in proportion to the transistor base current, when the transistors are unsaturated, and a plurality of switches, each switch connected in circuit with the diode of a respective step circuit and operating in response to an input digital signal to render the diode either conductive or nonconductive.

* * * * *